United States Patent [19]

Shinagawa et al.

[11] Patent Number: 5,478,403
[45] Date of Patent: Dec. 26, 1995

[54] PROCESS AND APPARATUS FOR ASHING TREATMENT

[75] Inventors: Keisuke Shinagawa, Kawasaki; Shuzo Fujimura, Tokyo, both of Japan

[73] Assignee: Fujitsu Limited, Kawasaki, Japan

[21] Appl. No.: 363,987

[22] Filed: Dec. 27, 1994

Related U.S. Application Data

[63] Continuation of Ser. No. 213,991, Mar. 15, 1994, abandoned, which is a continuation of Ser. No. 34,202, Mar. 19, 1993, abandoned, which is a continuation of Ser. No. 429,474, Oct. 31, 1989, abandoned.

[30] Foreign Application Priority Data

Oct. 31, 1988 [JP] Japan .................. 63-275335

[51] Int. Cl.⁶ ................................. H05H 1/00
[52] U.S. Cl. ................ 134/1.1; 216/69; 156/643.1
[58] Field of Search .................. 156/643.1, 646.1; 134/1.1, 1.2, 31, 32; 216/69

[56] References Cited

U.S. PATENT DOCUMENTS

| | | | |
|---|---|---|---|
| 4,563,240 | 1/1986 | Shibata et al. | 156/643 |
| 4,767,496 | 8/1988 | Hieber | 156/646 X |
| 4,845,053 | 7/1989 | Zajac | 437/229 |

FOREIGN PATENT DOCUMENTS

| | | |
|---|---|---|
| 0237078 | 9/1987 | European Pat. Off. |
| 0275965 | 7/1988 | European Pat. Off. |
| 59-94422 | 5/1984 | Japan . |
| 241227 | 11/1985 | Japan .................. 156/345 |

OTHER PUBLICATIONS

Chiharu Takahashi et al., "An electron cyclotron resonance plasma deposition technique employing magnetron mode sputtering", Journal of Vacuum Science & Technology, vol. 6, No. 4 (second series), Jul./Aug. 1988, Woodbury, N.Y., pp. 2348–2352.

European Search Report conducted at The Hague by Examiner M. Sinemus and completed Jan. 3, 1990.

*Primary Examiner*—Thi Dang
*Attorney, Agent, or Firm*—Staas & Halsey

[57] ABSTRACT

A process and apparatus for the ashing treatment in which a plasma generated by activating a gas containing at least oxygen is applied to a material to be treated, on which a coating film of an organic is formed, through a plasma-transmitting plate for capturing charged particles in the plasma and allowing the transmission of neutral active species, to thereby ash the coating film of the organic substance. The material to be treated is placed at a position at which charged particles of a high energy, which have been transmitted through the plasma-transmitting plate without being captured by the plasma-transmitting plate, impinge thereon together with the neutral active species which have been transmitted through the plasma-transmitting plate. Also, the ashing treatment process and apparatus includes a distance-adjusting device for adjusting the distance between the plasma-transmitting plate and the material to be treated, by changing the position of the material to be treated.

14 Claims, 6 Drawing Sheets

5,478,403

PROCESS AND APPARATUS FOR ASHING TREATMENT

This application is a continuation of application Ser. No. 08/213,991, filed Mar. 15, 1994, now abandoned, which is a continuation of application Ser. No. 08/034,202, filed Mar. 19, 1993, now abandoned, which is a continuation of application Ser. No. 07/429,474, filed Oct. 31, 1989, now abandoned.

BACKGROUND OF THE INVENTION (1) Field of the Invention

The present invention relates to a process and apparatus for the ashing treatment of an organic substance coating film on a material to be treated, for example, a semiconductor wafer, by a plasma.

(2) Description of the Related Art

In the processing of a wafer of a semiconductor device, the basic operations of formation of a film, formation of a resist pattern, etching using the resist as a mask, and removal of the resist are repeated. As the resist-removing method in the above-mentioned cycle, a method is adopted in which the resist is ashed by using a plasma, and in this method, the resist must be removed efficiently without damage to the surface of the semiconductor wafer.

The conventional ashing treatment apparatus using a plasma is shown in FIG. 5. This ashing treatment apparatus is an oxygen down-stream type apparatus in which an oxygen plasma is applied to a semiconductor wafer.

A heating stage 14 on which a semiconductor wafer 12 to be treated is placed is arranged in an ashing treatment chamber 10 for effecting the ashing treatment, a gas-introducing opening 18 is formed in a plasma-generating chamber 16 for generating a plasma, to introduce an oxygen-containing gas to be converted to a plasma, and a microwave waveguide 22 is disposed so as to communicate with the chamber 16 through a quartz plate 20. An electroconductive plate 24 having many through holes, called a "shower plate", is arranged between the plasma-generating chamber 16 and the ashing treatment chamber 10, and this shower plate 24 is earthed (i.e. electrically grounded) to capture charged particles having a high energy, such as charged active species and electrons, in the plasma generated in the plasma-generating chamber 16, and allow a transmission therethrough of neutral active seeds which are electrically neutral and have a low energy. If the plasma is directly applied, the surface of the semiconductor wafer 12 will be severely damaged by charged particles having a high energy, and then the shower plate 24 is provided to eliminate this disadvantage. An exhaust opening 26 is arranged in the ashing treatment chamber 12 to discharge the gas formed by ashing.

When the ashing treatment is carried out by using this ashing treatment apparatus, the semiconductor wafer 12 to be subjected to the ashing treatment, and to which an organic coating film such as a resist is adhered, is placed on the heating stage 14 and heated. The oxygen-containing gas to be converted to a plasma is introduced into the plasma-generating chamber 16 from the gas-introducing opening 18, and simultaneously, a microwave of 2.45±0.1 GHz is applied to the microwave waveguide 22. The microwave is transmitted through the quartz plate 20 and acts on the gas in the plasma-generating chamber 16 to generate a plasma, and the generated plasma flows into the ashing treatment chamber 10 through the shower plate 24. The charged particles in the plasma are captured by the shower plate 24 and only the neutral active species which are not charged permeate through the shower plate 24 and impinge against the semiconductor wafer 12 on the heating stage 14. Accordingly, the shower plate 24 acts as a plasma-transmitting plate for capturing the charged particles in the plasma generated in the plasma-generating chamber 16 and allowing a transmission of the neutral active seeds. When the neutral active species impinge against the semiconductor wafer 12, mainly the neutral active seeds of oxygen oxidize and ash the organic substance coating film, for example, the resist, on the semiconductor wafer 12, and the gas formed by ashing is discharged from the exhaust opening 26.

The results of the measurement of the ashing characteristics obtained by the conventional ashing treatment apparatus are shown in FIG. 6.

A resist (OFPR800 supplied by Tokyo Oka) of a novolak resin having a thickness of 1.5 μm, and which is formed, by coating on a semiconductor wafer 12 having a thickness of 4 inches, is ashed under the following conditions. Namely, the output of the microwave is 1.5 kW, the pressure in the ashing treatment chamber 10 is 0.8 Torr, the oxygen flow rate in the introduced gas is 1 SLM, and the distance between the shower plate 24 and the semiconductor wafer 12 is 35 mm. The temperature θ(°C.) of the semiconductor wafer 12 is changed in the range of from 120° to 200° C., and the ashing rate (Å/min) is measured. FIG. 6 is an Arrhenius plot in which the ashing rate V (Å/min) is plotted on the ordinate and $(1/T) \times 10^3$ (°K$^{-1}$), in which T represents the absolute temperature (°K) calculated by adding 273 to the temperature θ (°C.), is plotted on the abscissa. From the gradient of this graph, it is seen that the activation energy at the ashing treatment is about 0.5 eV. The activation energy value of 0.5 eV is in full agreement with the value measured when the ashing treatment is effected mainly by a chemical reaction between active species of oxygen and the resist (J. M. Cook and B. W. Benson, J.Electrochem. Soc., Vol. 13, No. 12, P.2459 (1983); J. E. Spencer, R. A. Borel and A. Hoff, Electrochemical Society Extended Abstracts, Vol. 86-2, Oct. 19–24 (1986), Abstract No. 285).

As apparent from the graph of FIG. 6, in the ashing treatment of the conventional ashing treatment apparatus, the ashing rate greatly depends on the temperature of the semiconductor wafer 12. More specifically, when the temperature of the semiconductor wafer 12 is 200° C., the ashing rate is $20 \times 10^3$ (Å/min), but as the temperature is lowered, the ashing rate is drastically reduced and when the temperature is 120° C., the ashing rate is about $3.8 \times 10^3$ (Å/min), i.e., lower than ¼ of the ashing rate attained at 200° C. It is difficult to keep the temperature of the semiconductor wafer 12 constant, and the ashing rate is greatly changed by a slight change of the temperature, and thus it is difficult to obtain a stable ashing rate. This temperature dependency however, is peculiar to the chemical reaction of the ashing treatment, and therefore, it has been considered that, to moderate this temperature dependency, it is necessary to change the reaction per se of the ashing treatment by changing the resist or the introduced gas, but it is difficult to obtain an improvement by this moderation.

In view of the plasma contamination, preferably the ashing treatment is carried out at a lower temperature, but according to the conventional ashing treatment, especially at low temperature, the ashing rate is low and a long time is required for completion of the ashing treatment and, therefore, the conventional ashing treatment has the problem of low productivity.

SUMMARY OF THE INVENTION

The present invention was completed under the above-mentioned background, and a primary object of the present invention is to provide a process and apparatus for ashing treatment in which the ashing rate is not greatly changed by a change of the temperature, and thus the ashing treatment can be carried out at a high ashing rate.

In accordance with one aspect of the present invention, the foregoing object can be attained by a process for ashing treatment which comprises applying a plasma, generated by activating a gas containing at least oxygen to a material to be treated and to which material a coating film of an organic substance is adhered, through a plasma-transmitting plate for capturing charged particles in the plasma, and for allowing the transmission of neutral active species, to thereby ash the coating film of the organic substance, wherein the material to be treated is placed at a position at which charged particles of a high energy, which have been transmitted through the plasma-transmitting plate without being captured by the plasma-transmitting plate, impinge thereon together with the neutral active species which have been transmitted through the plasma-transmitting plate.

Furthermore, in accordance with another aspect of the present invention, the foregoing object can be attained by an apparatus for ashing treatment which comprises a plasma-generating chamber, for generating a plasma by activating a gas containing at least oxygen, a plasma-transmitting plate for capturing charged particles in the plasma generated in the plasma-generating chamber and for allowing the transmission of neutral active species therethrough, and a mounting stand on which material a material to be treated, to which a coating film of an organic substance to be ashed is adhered, is placed, the coating film of the organic substance being ashed by applying the plasma to the material to be treated through the plasma-transmitting plate, wherein distance-adjusting means for adjusting the distance between the plasma-transmitting plate and the material to be treated, by changing the position of the mounting stand, is further disposed.

DESCRIPTION OF THE PREFERRED EMBODIMENTS

According to the present invention, since charged particles of a high energy temperature, which have been transmitted through he plasma-transmitting plate without being captured by the plasma-transmitting plate, are applied to a material to be treated together with neutral active species which have been transmitted through the plasma-transmitting plate, the ashing speed is elevated as a whole and the temperature dependency is moderated.

The present invention will now be described in detail with reference to embodiments shown in the accompanying drawings.

Figure 1:
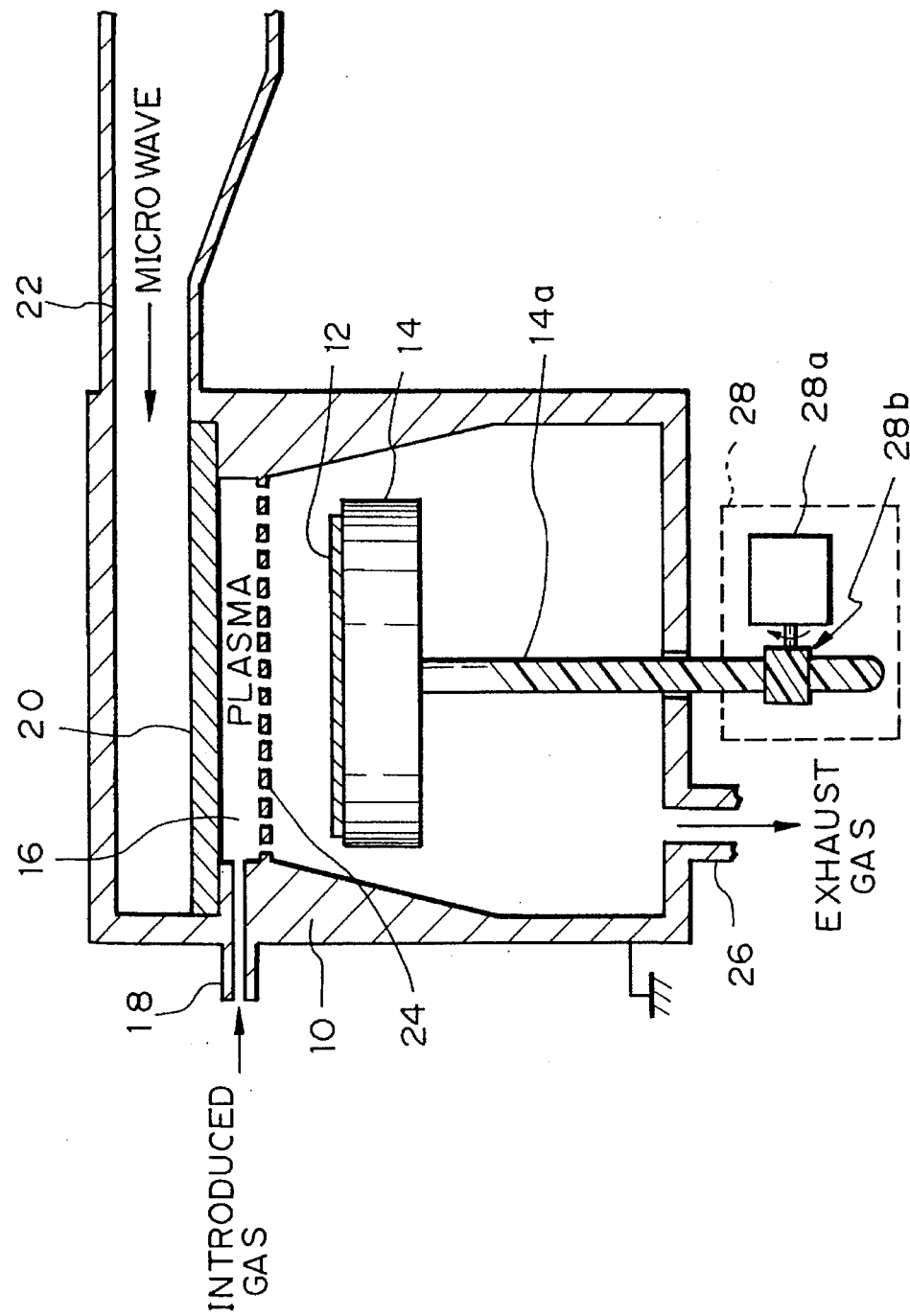
FIG. 1 is a sectional view illustrating one embodiment of the ashing treatment apparatus according to the present invention.
Figure 5:
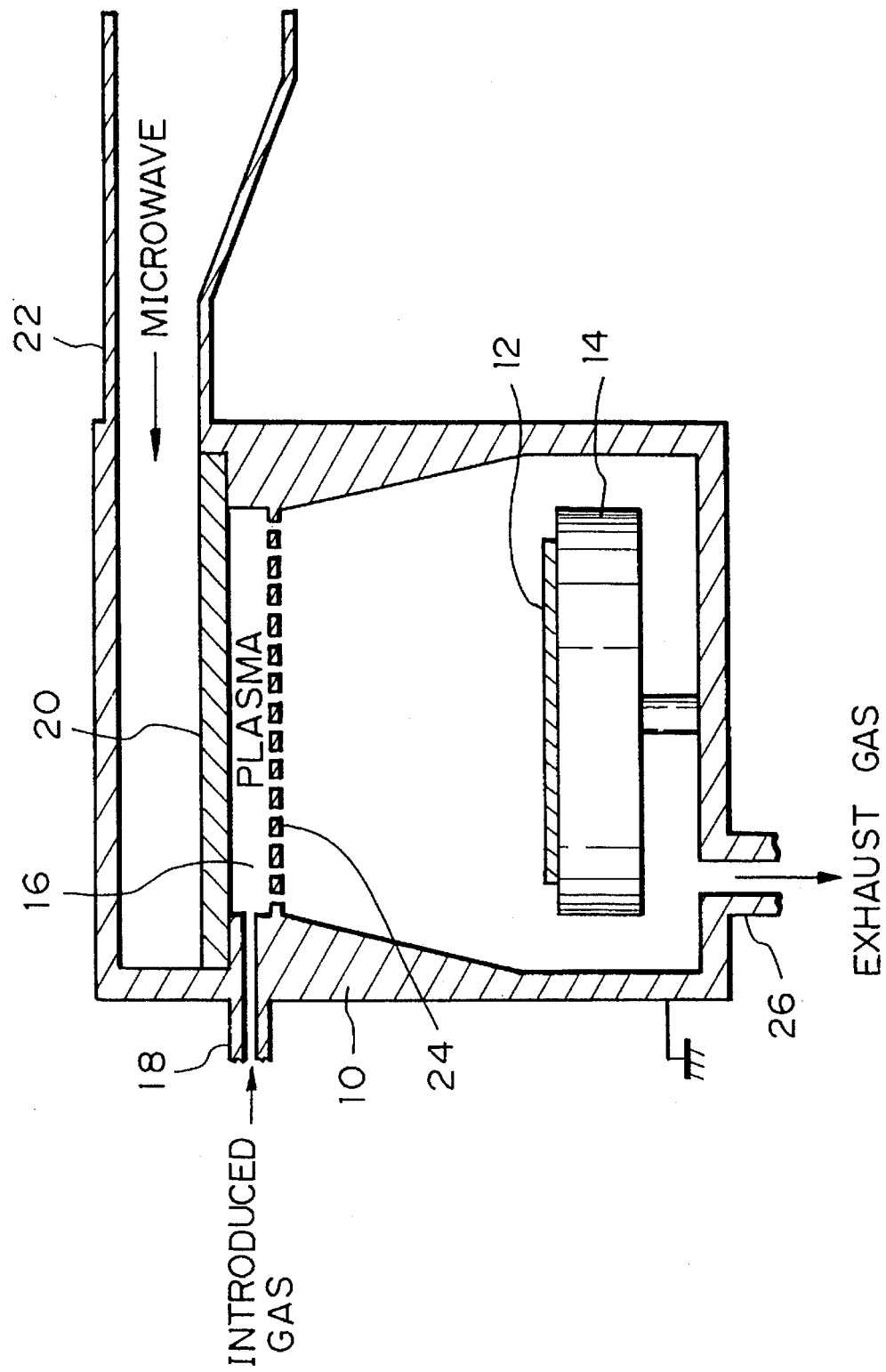
FIG. 5 is a sectional view illustrating the conventional treatment apparatus.

FIG. 1 shows one embodiment of the ashing treatment apparatus according to the present invention. Elements having the same structure as in the ashing treatment apparatus shown in FIG. 5 are represented by the same reference numerals as used in FIG. 5, and an explanation of these elements is omitted.

The ashing treatment apparatus of the present embodiment is characterized in that a vertical driving device 28 for vertically driving the heating stage 14 is disposed, to adjust the distance between the semiconductor wafer 12 to be subjected to the ashing treatment and the shower plate 24 and change the mounting position of the semiconductor wafer 12. A pole 14a of the heating stage 14 pierces the wall of the ashing treatment chamber 10 and is connected to the vertically driving device 28 disposed outside thereof. A worm gear mechanism 28b is rotated by a motor 28a to vertically drive the pole 14a.

The influence of the adjustment of the distance between the shower plate 24 and the semiconductor wafer 12 by driving the heating stage 14 by the vertical driving device 28 during the ashing treatment will now be described.

The plasma generated in the plasma-generating chamber 16 contains not only uncharged neutral active species but also charged particles such as charged active species and electrons. The shower plate 24 is disposed to capture the charged particles and allow the transmission of only the neutral active species which are electrically neutral and have a low energy. In practice, however, the charged particles are not completely captured by the shower plate 24, and parts thereof flow into the ashing treatment chamber 10. In the charged particles which have flowed into the ashing treatment chamber 10 through the shower plate 24, the electron temperature is lowered as the distance from the shower plate 24 increases. Accordingly, the adjustment of the distance from the shower plate 24 results in the adjustment of the electron temperature of the charged particles acting on the semiconductor wafer 12.

The ashing treatment apparatus of the present embodiment is characterized in that the electron temperature of the charged particles acting on the semiconductor wafer 12 can be adjusted by adjusting the distance between the shower plate 24 and the semiconductor wafer 12 by the vertically driving device 28.

As apparent from the foregoing description, according to the ashing treatment apparatus of the present embodiment, the semiconductor wafer is mounted at a position spaced apart by an optional (i.e. selectively varying) distance, from the shower plate, so as to adjust the electron temperature of the acting charged particles, and the ashing treatment is carried out in this state.

The ashing treatment process using the ashing treatment apparatus of the present embodiment will now be described.

Figure 2:
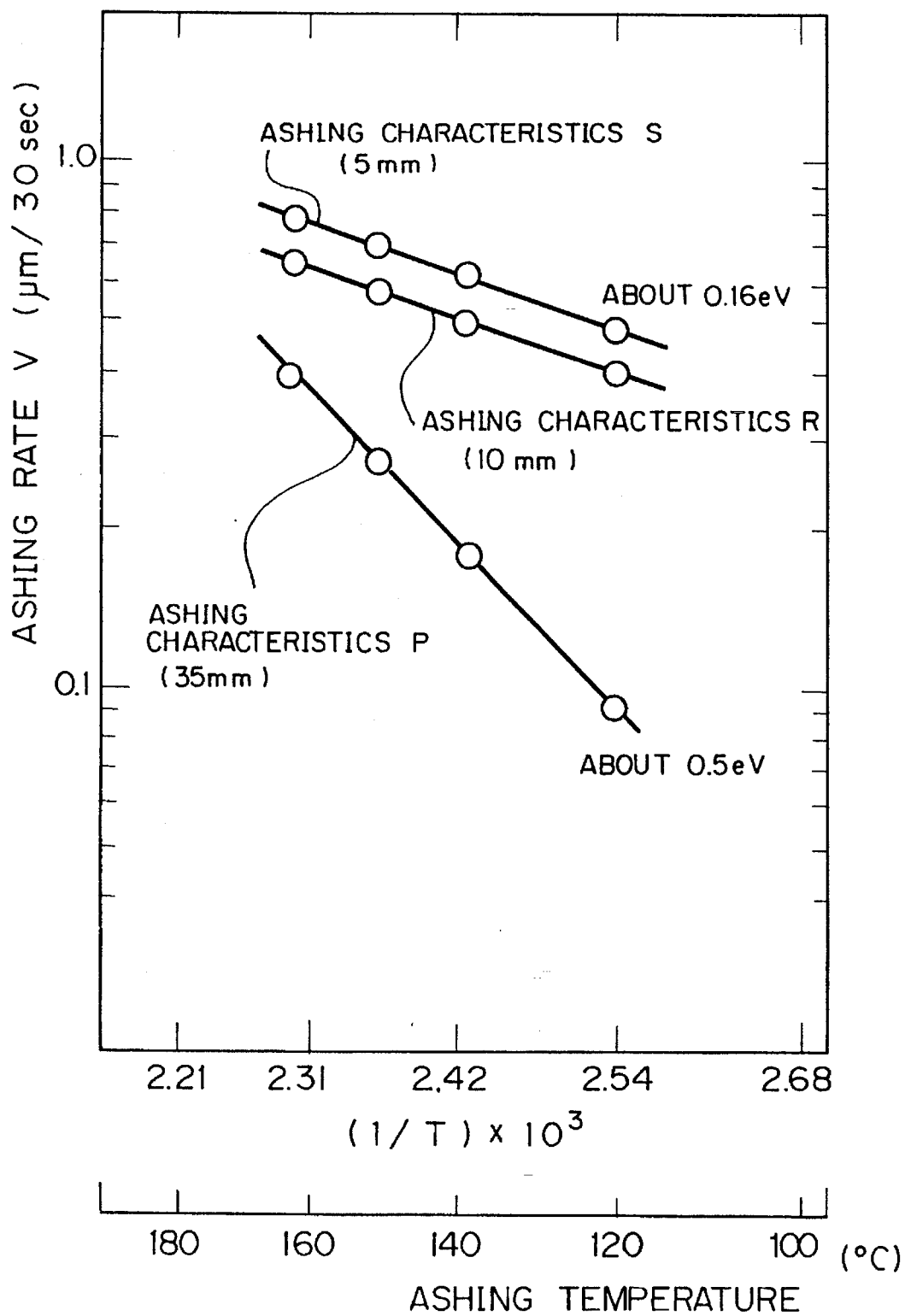
FIG. 2 is a graph illustrating the characteristics of one embodiment of the ashing treatment process according to the present invention.
Figure 6:
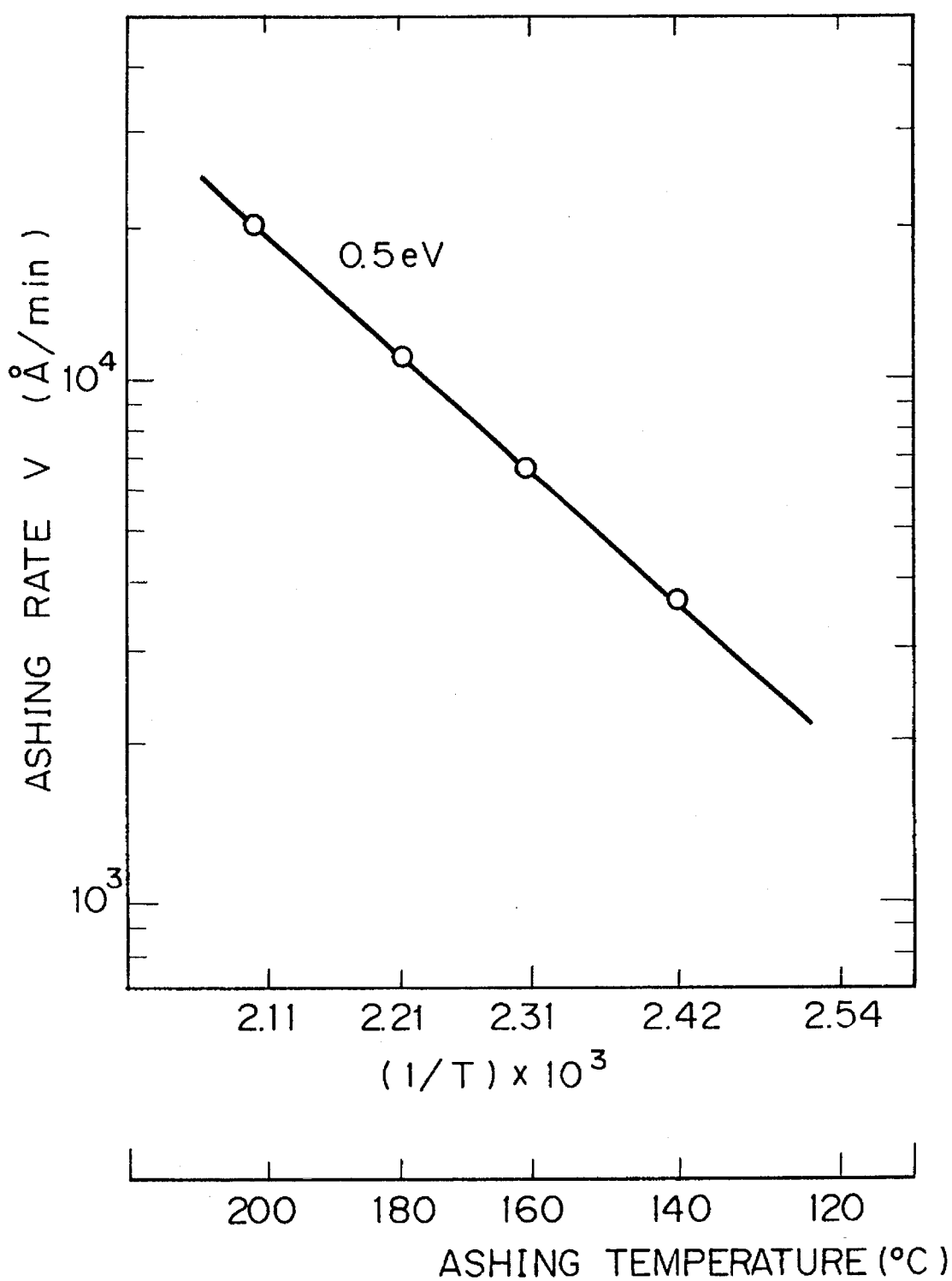
FIG. 6 is a graph illustrating the ashing treatment characteristics of a conventional treatment process.

The results of the measurement of the ashing treatment characteristics, conducted by changing the distance between the shower plate 24 and the heating stage 14 (defined as the distance between the lower face of the shower plate 24 and the upper face of the heating stage 14) according to the process of the present embodiment, are shown in FIG. 2. Conditions such as the output of the microwave, the pressure in the ashing treatment apparatus 10, the flow rate of oxygen in the introduced gas, and the resist to be treated are the same as those adopted for obtaining the data shown in FIG. 6.

In FIG. 2, P shows the characteristics of the conventional ashing treatment, where the distance between the shower plate 24 and the heating stage 14 (hereinafter referred to as "distance from the shower plate 24") is 35 mm, R shows the ashing characteristics obtained when the distance from the shower plate 24 is 10 mm, and S shows the ashing characteristics obtained when the distance from the shower plate 24 is 5 mm. From these ashing characteristics P, R, and S it is seen that, as the distance from the shower plate 24 becomes short, the ashing rate V is increased as a whole and the activation energy is lowered. Namely, in the ashing characteristics P obtained when the distance from the shower plate 24 is 35 mm, the activation energy is about 0.5 eV, but in the ashing characteristics R and S obtained when the distances from the shower plate 24 are 10 mm and 5 mm, the activation energy is about 0.16 eV. The lowering of the activation energy results in a moderation of the temperature dependency of the reaction speed V.

Accordingly, if the distance from the shower plate 24 is made shorter than 35 mm and is adjusted to less than 20 mm, the ashing speed V is not greatly changed even when the temperature of the semiconductor wafer 12 is changed, and the ashing treatment can be completed in a shorter time than in a conventional process, whereby the productivity can be improved.

The mechanism of the ashing treatment will now be considered. As pointed out hereinbefore, the activation energy is peculiar to the chemical reaction, and the value of the activation energy is not changed unless the reaction per se, i.e., the introduced gas or resist, is changed. Nevertheless, in the process of the present embodiment, even though the reaction per se is not changed, the activation energy is lowered merely by shortening the distance from the shower plate 24. It is considered that, in the process of the present embodiment, ashing is advanced by not only a pure chemical action but also a physical action.

The plasma making a contribution to the ashing contains not only uncharged neutral active species but also charged particles such as charged active species and electrons. It is known that, since the neutral active species are not charged, the neutral active species exert only a chemical action on an organic substance coating film to be ashed, such as a resist. In contrast, it is considered that the charged particles, such as charged active species or electrons, promote ashing by a chemical action and physical action, singly or in co-operation with the neutral active species. This mechanism has not been sufficiently elucidated, but by the action of the charged articles on the coating film of the organic substance together with the action of the neutral active species, ashing is accelerated and the activation energy is lowered.

As apparent from the foregoing description, the ashing treatment process of the present embodiment is characterized in that the charged particles as well as the neutral active species in the plasma make a contribution to the advance of the ashing reaction. To clarify this characteristic feature, the relationship between the distance from the shower plate and the electron temperature of charged particles and the recovery time is examined. The results are shown in FIG. 3 and 4, respectively.

Figure 3:
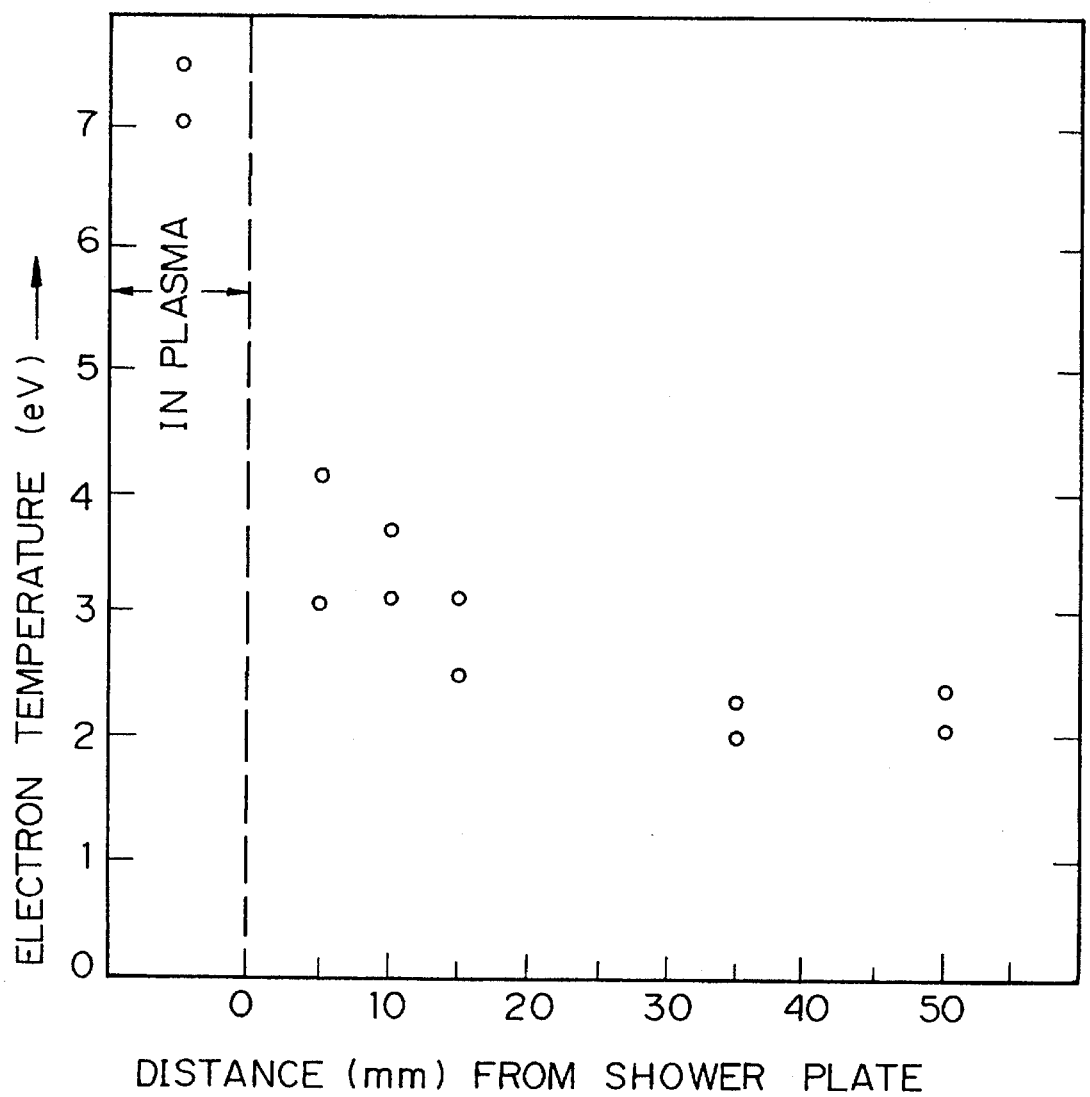
FIG. 3 is a graph illustrating the distance dependency of the electron temperature.

The electron temperatures shown in FIG. 3 are those measured by the Langmuir probe method. From FIG. 3 it is seen that, as the distance from the shower plate becomes shorter, the electron temperature becomes higher. Accordingly, it is considered that the ashing rate is high in FIG. 2 when the distance from the shower plate is 5 mm or 10 mm, because charged particles (electrons) having a high electron temperature contribute to the ashing reaction.

The contamination of the semiconductor wafer at the ashing treatment is caused by an intrusion of contaminant molecules contained in the resist, such as iron, to the semiconductor wafer. Where neutral active seeds in the plasma act on the resist, since only the chemical reaction occurs, contaminant molecules contained in the resist do not intrude to the semiconductor wafer. However, where charged particles in the plasma act on the resist, since the energy of the charged particles is high, the charged particles are violently implanted into the resist and the implanted charged articles impinge against the contaminant molecules in the resist, whereby the contaminant molecules are implanted and intrude into the semiconductor wafer. Accordingly, the intensity of the action of the charged particles of the plasma can be determined.

Figure 4:
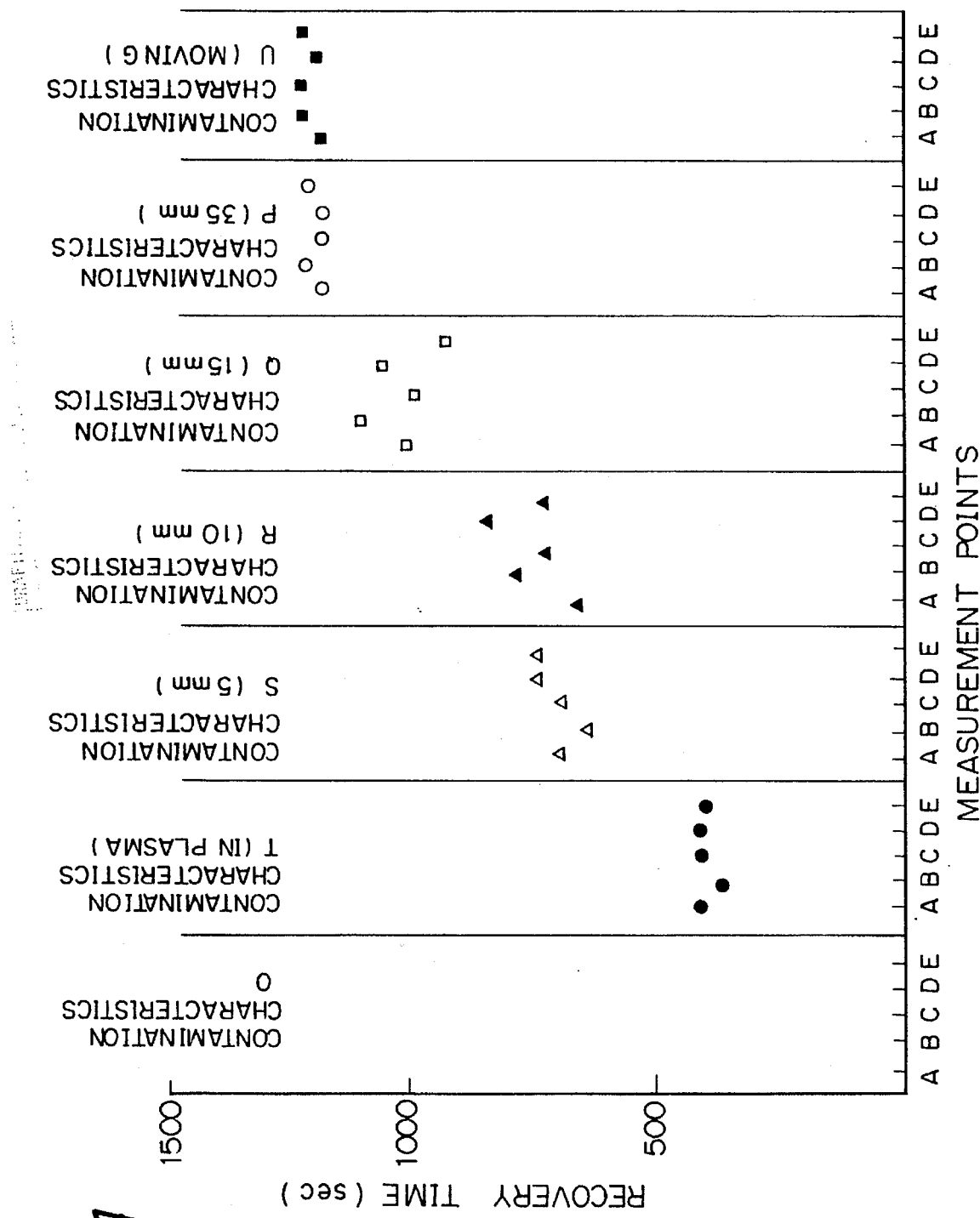
FIG. 4 is a graph showing the contamination characteristics in the ashing treatment process shown in FIG. 2.

FIG. 4 shows the results obtained by preparing an MOS diode and measuring the degree of contamination by the CT method. The recovery time (sec) of the MOS diode indicating the contamination degree is plotted on the ordinate. A shorter recovery time indicates a higher contamination degree. The points for the measurement of the contamination degree are shown on the abscissa, and points A through E of the semiconductor wafer are the measurement points. The contamination characteristics P are those obtained in the conventional process where the distance from the shower plate 24 is 35 mm, the contamination characteristics Q are those obtained when the distance from the shower plate 24 is 15 mm, and the contamination characteristics R are those obtained when the distance from the shower plate 24 is 10 mm. Furthermore, the contamination characteristics S are those obtained when the distance from the shower plate 24 is 5 mm, and the contamination characteristics 0 are those obtained when the resist processing, such as the resist coating or resist ashing, is not carried out. Moreover, the contamination characteristics T are those obtained when the treatment is carried out in the plasma. From the contamination characteristics P through S it is seen that, as the distance from the shower plate 24 becomes shorter, the contamination is advanced as a whole. Accordingly, it is seen that, as the distance from the shower plate 24 becomes shorter, the intensity of the action of charged particles in the plasma is increased. Furthermore, because the contamination characteristics P obtained when the distance from the shower plate 24 is 35 mm are equal to the contamination characteristics 0 obtained when the resist processing is not carried out, it can be seen that, when the distance from the shower plate 24 is as long as about 35 mm, the charged particles do not act at all.

From the foregoing results of the measurement of the contamination characteristics it is seen that, according to the ashing treatment process of the present embodiment wherein the ashing treatment is carried out while adjusting the distance from the shower plate 24 to less than 20 mm, not only neutral active species but also charged particles in the plasma make a contribution to the ashing.

Note, from the ashing characteristics shown in FIG. 2 and the contamination characteristics shown in FIG. 4 it is seen that, if the distance from the shower plate 24 is made shorter, the ashing characteristics are improved but the degree of contamination is increased. The allowable degree of contamination of a semiconductor wafer differs according to the kind of fabricated semiconductor device or the preparation steps. According to the present embodiment, the ashing characteristics and the contamination characteristics can be controlled simply by adjusting the distance from the shower plate. Therefore, the distance from the shower plate can be controlled so that good ashing characteristics can be obtained while adjusting the contamination characteristics within the allowable range. More specifically, by vertically moving the heating stage 14 by the vertically driving device 28 shown in FIG. 1, the distance from the shower plate 24 is adjusted so that the ashing treatment can be carried out most efficiently.

The present invention is not limited to the foregoing embodiment but various modifications can be made thereto.

In the foregoing embodiment, the ashing treatment is carried out in the state where the material to be treated is located at a position less than 20 mm from the shower plate. In the present invention, it is sufficient if the material to be treated is located at a position at which charged particles of a high electron temperature which are not captured by the shower plate but are transmitted therethrough, impinge thereon together with neutral active seeds of the plasma which are transmitted through the shower plate.

In the foregoing embodiment, the plasma is generated by the microwave of 2.45±0.1 GHz, but the plasma can be generated by other methods, for example, application of a microwave of 13.56 MHz, application of a direct current voltage, and an irradiation with light.

In the foregoing embodiment, the resist is subjected to the ashing treatment, but the present invention also can be applied to the ashing treatment of a coating film of an organic substance such as a polyimide. Moreover, other gases containing nitrogen, steam, nitrogen oxide, hydrogen or halogen in addition to oxygen can be used as the introduced gas.

In the ashing treatment apparatus of the above embodiment, the heating stage on which the semiconductor wafer as the material to be treated is placed is vertically moved by the vertically driving device 28, but the distance between the shower plate and the material to be treated can be adjusted by other means.

Another embodiment of the present invention will now be described. In this embodiment, a microwave output of 1.5 kW, a plasma-generating chamber pressure of 0.8 Torr and an oxygen gas flow rate of 1 SLM are adopted as the ashing conditions as in the foregoing embodiment. The stage temperature is 160° C. and the ashing time is 60 seconds. The movable heating stage is driven so that the distance from the shower plate at the start of the ashing treatment is 5 mm and the stage is separated from the shower plate at a speed 1 mm/sec after the start of the ashing treatment. When 30 seconds have passed from the start of the ashing treatment, the distance from the shower plate is 35 mm. At this point, where the distance from the shower plate is 35 mm, the movement of the stage is stopped, and for the remaining 30 seconds, the ashing treatment is carried out at this point. The ashing rate is 1 μm/min.

The contamination characteristics U obtained in this embodiment are shown in FIG. 4. The contamination characteristics U are substantially the same as the contamination characteristics O and P, and it was determined that no substantial contamination occured at the ashing treatment. The ashing rate is about 2 times the ashing rate attained in the conventional process, in which the distance from the shower plate is 35 mm.

According to the above-mentioned second embodiment of the present invention, the problem caused in the ashing treatment by the oxygen down-stream ashing, i.e., the tradeoff relationship between the increase of the ashing rate and decrease of the degree of contamination, can be solved. Namely, the ashing treatment can be performed at a high ashing rate with less contamination.

As apparrent from the foregoing description, according to the present invention, the ashing rate is not greatly changed even if the temperature is changed, and the ashing treatment can be performed at a high ashing rate.

We claim:

1. A process for ashing treatment of an organic substance coated onto a material to be treated, said process comprises the steps of:

generating a plasma by activating a gas containing at least oxygen;

applying said plasma to the material to be treated through a plasma-transmitting plate, said plasma-transmitting plate capturing charged particles in said plasma and allowing the transmission therethrough of neutral active species;

placing the material to be treated at a starting position at which charged particles of high energy impinge thereon together with said neutral active species which have been transmitted through said plasma-transmitting plate, said charged particles of high energy having been transmitted through said plasma-transmitting plate and not captured by said plasma-transmitting plate; and moving said material to be treated from said starting position in a direction away from said plasma-transmitting plate during the advance of said ashing treatment and controlling the moving speed so as to maintain a substantially constant rate of ashing of the organic substance.

2. A process according to claim 1, wherein said starting position is less than approximately 20 mm from said plasma-transmitting plate.

3. A process according to claim 2, wherein said step of moving the material to be treated includes the substep of:

stopping the movement of the material to be treated when the material to be treated has reached a stopping position at which the material to be treated is about 35 mm from said plasma-transmitting plate.

4. A process according to claim 3, wherein said moving speed is approximately 1 mm/sec.

5. A process according to claim 1, wherein the substantially constant ashing rate is approximately 1 μm/min.

6. An ashing treatment process for ashing an organic substance coated as a film onto a material, said process comprising the steps of:

generating a plasma by activating a reactive gas;

applying said plasma to the organic substance film through a plasma-transmitting plate, wherein said plasma-transmitting plate captures some charged particles in said plasma and allows the transmission therethrough of neutral active species and non-captured charged particles;

placing the organic substance film at a starting position, relatively to the plasma-transmitting plate, at which non-captured charged particles of high energy and said neutral active species, which have been transmitted through said plasma-transmitting plate, impinge thereon; and moving the organic substance from said starting position in a direction away from plasma-transmitting plate during said ashing and at a speed selected to maintain a substantially constant rate of ashing of the organic substance.

7. A method of operating a downstream type ashing apparatus for ashing treatment of a film of an organic substance, the apparatus having a plasma-generating chamber and an ashing treatment chamber separated by a shower plate, said process comprising the steps of:

generating a plasma in the plasma-generating chamber, the plasma containing charged particles and neutral active species, the neutral active species of the generated plasma passing through, and a first portion of the charged particles of the generated plasma being captured by and a second portion of the charged particles of the generated plasma passing through, the shower plate and into the ashing treatment chamber;

placing the organic substance film at a starting position within the ashing treatment chamber, downstream of the plasma generating chamber relatively to the shower plate and such that the neutral active species and the second portion of the charged particles passing through the shower plate impinge thereon, the starting position being selected to establish a desired rate of ashing of the organic substance film; and moving the organic substance film from the starting position and downstream, relatively to the shower plate, at a speed selected to maintain the desired rate of the ashing substantially constant, while moving.

8. The method as recited in claim 7, further comprising: moving the organic substrate film downstream to a second position at a distance from the shower plate at which any of the second portion of charged particles, which pass through the shower plate, substantially do not impinge, or otherwise act, on the organic substance film.

9. The method as recited in claim 8 wherein the distance of the second position from the shower plate is approximately 35 mm.

10. The method as recited in claim 9 wherein the distance of the first position from the shower plate is less than approximately 20 mm.

11. A method of operating a downstream type ashing apparatus for ashing treatment of a film of an organic substance, the apparatus having a plasma-generating chamber and an ashing treatment chamber separated by a shower plate, said process comprising the steps of:

generating a plasma in the plasma-generating chamber, the plasma containing charged particles and neutral active species, the neutral active species of the generated plasma passing through, and a first portion of the charged particles of the generated plasma being captured by and a second portion of the charged particles of the generated plasma passing through, the shower plate and into the ashing treatment chamber;

placing the organic substance film at a starting position within the ashing treatment chamber, downstream of the plasma generating chamber relatively to the shower plate and such that the neutral active species and the second portion of the charged particles passing through the shower plate impinge thereon;

moving the organic substance film from the starting position and to a further downstream position, relatively to the shower plate; and selecting the starting position and the speed of moving the organic substance film from the starting position to the further downstream position in accordance with establishing a desired rate of ashing initially, at the starting position, and so as to maintain a stable ashing rate whilethe organic substance film is moved to, and while positioned at, the second position, and while not exceeding an acceptable rate of contamination of the organic substance film resultant from the second portion of charged particles impinging thereon.

12. The method as recited in claim 11 wherein the further downstream, second position is selected to be at a distance from the shower plate at which any of the second portion of charged particles which pass through the shower plate substantially do not impinge on or otherwise act on the organic substance film.

13. The method as recited in claim 12 wherein the distance of the second position from the shower plate is approximately 35 mm.

14. The method as recited in claim 13 wherein the distance of the first position from the shower plate is less than approximately 20 mm.

* * * * *

UNITED STATES PATENT AND TRADEMARK OFFICE
CERTIFICATE OF CORRECTION

PATENT NO. : 5,478,403
DATED : Dec. 26, 1995
INVENTOR(S) : SHINAGAWA et al.

It is certified that error appears in the above-indentified patent and that said Letters Patent is hereby corrected as shown below:

TITLE PAGE: [57] ABSTRACT:
    line 4, after "organic" insert --substance--.

Col. 3,   line 54, change "the" to --a--;
         line 55, after "apparatus;" insert --and--.

Col. 10,  line 23 (claim 11, line 28), change "whilethe" to --while the--.

Signed and Sealed this

Ninth Day of July, 1996

Attest:

BRUCE LEHMAN

*Attesting Officer*      Commissioner of Patents and Trademarks